United States Patent [19]

Bayley et al.

[11] 4,215,928

[45] Aug. 5, 1980

[54] APPARATUS FOR TREATING THE SURFACES OF CYLINDRICAL OBJECTS IN A NUMBER OF SEQUENTIAL STEPS

[75] Inventors: Barry J. Bayley, Newton-le-Willows, England; Austin Brittain, Dumfries, Scotland; Kenneth Graham, St. Lukes, Near Warrington, England; Clive S. Thawley, Dumfries, Scotland

[73] Assignee: Uniroyal Limited, Newbridge, Scotland

[21] Appl. No.: 25,633

[22] Filed: Mar. 30, 1979

[30] Foreign Application Priority Data

Apr. 11, 1978 [GB] United Kingdom ............... 14222/78

[51] Int. Cl.² ............................................. G03D 5/04
[52] U.S. Cl. .................................... 354/319; 354/325; 134/80; 134/153
[58] Field of Search ............... 354/306, 317, 325, 326, 354/331, 332, 337, 319; 134/78, 79, 80, 81, 153, 158, 183

[56] References Cited

U.S. PATENT DOCUMENTS

| 2,189,451 | 2/1940 | Peters ...................................... 134/81 |
| 2,861,508 | 11/1958 | Baumbach et al. .................. 354/325 |
| 3,675,563 | 7/1972 | Metreaud ............................. 354/325 |
| 3,727,536 | 4/1973 | Bunker ................................. 354/317 |
| 3,812,514 | 5/1974 | Watabe ................................. 354/325 |

FOREIGN PATENT DOCUMENTS 2102425 7/1972 France ...................................... 134/80

Primary Examiner—L. T. Hix
Assistant Examiner—Alan Mathews
Attorney, Agent, or Firm—Charles A. Blank

[57] ABSTRACT

Apparatus for treating the surfaces of cylindrical objects in a number of sequential steps and, more particularly, for treating photopolymer printing cylinders in alignment with separate treatment bays. The cylinders are individually rotated in each compartment about their individual axes.

9 Claims, 3 Drawing Figures

APPARATUS FOR TREATING THE SURFACES OF CYLINDRICAL OBJECTS IN A NUMBER OF SEQUENTIAL STEPS

This invention relates to apparatus for treating the surfaces of cylindrical objects in a number of sequential steps.

There are many fields wherein it is necessary to treat the outer surface of a cylinder by a succession of processes, and many methods of handling the cylinder during that treatment have been used. The objective of the present invention is to provide a compact apparatus which can be used for processing cylinders and which is designed to ensure that the whole surface of the cylinder can be equally treated in each process step.

According to the present invention, apparatus for treating the surfaces of cylindrical objects in a number of sequential steps comprises a carrier rotatable about a central axis, the carrier having a central section and a plurality of walls extending radially from the central section to define a radial series of compartments, means for rotating the carrier about said central axis, mounting means in each compartment for releasably engaging opposite ends of a cylindrical object to support said object in said compartment with the axis of said object parallel to said central axis, means for rotating said mounting means to rotate said object about its axis, a series of treatment bays arranged around the circumference of the carrier, means separating each treatment bay from any adjacent bay, cooperating sealing means on each separating means and each wall for creating a seal when the wall and separating means are radially aligned, and means for indexing said carrier through a plurality of angular positions wherein each compartment sequentially confronts a respective treatment bay and is sealed from adjacent treatment bays by said sealing means.

The arrangement of providing compartments around the central axis of a rotating carrier, and the provision in each compartment of means for independently rotating a cylinder mounted therein provides a very compact arrangement, and the rotation of each cylinder within its compartment allows the whole of the surface of the cylinder to be treated in each one of the bays.

Preferably the apparatus is designed to be used with the central axis vertical and the means for indexing the carrier and for rotating the mounting means are disposed in the lower portion of the apparatus.

Preferably the carrier comprises a base in the form of a turntable supported by wheels or rollers and the means for indexing the carrier is a first electric motor driving said turntable by way of a first chain drive.

Preferably all of the mounting means are rotated by gearing from a second electric motor. Such gearing conveniently comprises a sun-wheel co-axial with the central axis and a series of planet wheels engaging the sun-wheel, each planet wheel also meshing with gearing connected to at least one of the mounting means.

Preferably the apparatus is such that as well as indexing the carrier so that each compartment confronts a series of respective treatment bays, there are two further positions, in one of which a cylinder can be loaded into a compartment and in the other of which a cylinder can be unloaded from a compartment.

Preferably the mounting means comprises upper and lower conical elements for engaging the upper and lower ends of a hollow cylindrical object respectively, the lower element being connected to the rotating means and the upper element being axially movable towards and away from the lower element to releasably engage the cylindrical object. Means for raising and lowering the upper conical element may be associated with each of the loading and unloading bays.

In order that the invention may be better understood a specific embodiment thereof will now be described in more detail, by way of example only, with reference to the accompanying drawings in which.

Figure 1:
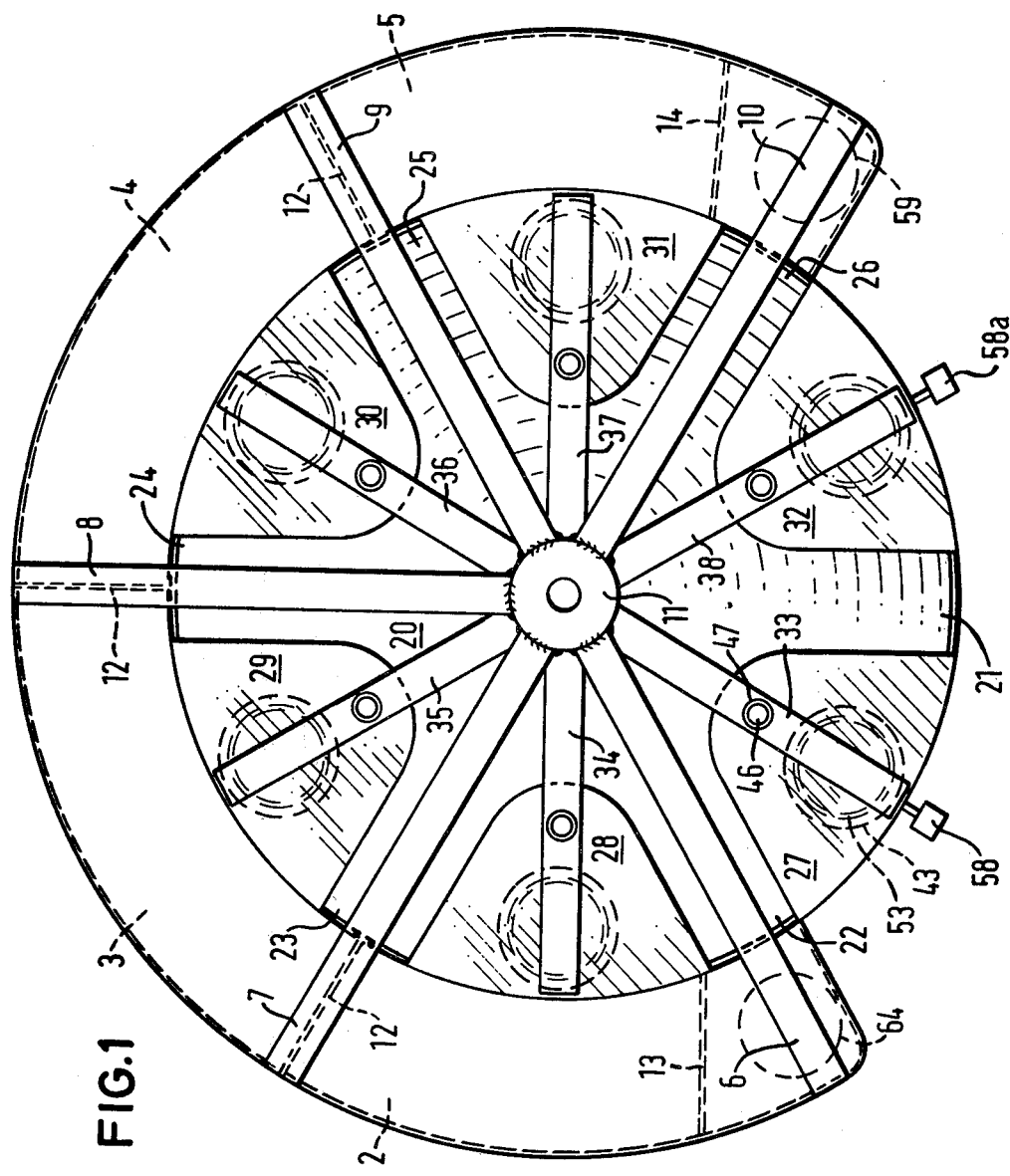
FIG. 1 is a top plan view of the apparatus.

Referring now to the drawings, the apparatus comprises a base 1 from which four structures defining treatment bays 2, 3, 4 and 5 are upstanding. The upper ends of the bays are supported by supports 6 to 10 radiating from a central plate 11. Adjacent bays are separated by walls 12 and bays 2 and 5 also have side walls 13 and 14 respectively. The radially inwardly facing area of each bay is open towards the axis of the apparatus.

The base houses a central bearing 15 which supports the lower end of a centre pillar 16 of a carrier, the upper end of the pillar 16 being received in a bearing (not shown) supported by the plate 11. Secured to the pillar 16 near the foot thereof is a turntable 17 having a circular support track 18 on its lower surface, which support track is supported by a series of rollers such as 19 spaced around the circumference of the turntable, each roller being journalled for rotation on a support upstanding from the base 1. The carrier has a central section 20 secured to the turntable and six walls 21 to 26 extend radially from the central section to define a radial series of compartments 27 to 32. In addition to the walls 21 to 26 a series of arms 33 to 38 extend from the centre section 20 so that each arm has a part lying above the respective compartment 27 to 32.

In each compartment the turntable is provided with two axially extending sleeves such as 39 and 45. As the arrangement for each compartment is identical only that for compartment 27 will be described. Each sleeve 39 houses therein bearings 40 and 41 which support for rotation a spindle 42 having a conical mounting plate 43 secured thereto and having a drive pinion 44 secured to the lower end thereof. An axially extending rod 46 is received loosely in the sleeve 45 and is also received loosely in a bushing 47 secured to the arm 33. The rod 46 has secured thereto a plate 48 having an axial bore in which are mounted bearings 49 and 50 supporting for rotation a spindle 51 having a conical mounting member 52 secured thereto. The conical mounting members 43 and 52 face towards each other and are axially aligned so that a hollow cylindrical object 53 to be treated can be mounted between the two elements. The rod 46 carries a bush 46a which fits over sleeve 45 and is axially movable with the rod in order to limit the distance that the rod 46 may move downwardly. The plate 48 may be secured to the rod in a fixed manner or in a manner that allows the plate 48 to be adjusted along the length of the rod and secured in any desired location thereon.

At each of the loading and unloading bays there is a cylinder loading or unloading arrangement. That for the loading bay will be described, it being understood that the arrangement for the unloading bay is identical.

The arrangement comprises a lever 54 pivoted at 55 and having one end 56 turned upwardly with a plate 57 secured thereto. This plate lies immediately under the lower end of the rod 46 when the apparatus is in the respective loading or unloading position. The opposite end of the lever terminates in a foot-pedal 58 and it will readily be seen that by depressing the foot-pedal the rod 46 is lifted so lifting the conical mounting element 52 and allowing the cylinder either to be removed from between the elements 43 and 52 or placed between those elements.

The turntable 17 is driven about its axis by an electric motor 59 connected through a gearbox (not shown) to a sprocket 61 which is engaged by a chain 62 which also engages a sprocket 63 secured to the lower end of the pillar 16. The motor 59 is a controlled stepping motor so that each time it is operated it drives the turntable through a pre-set angular distance of 60°, that is sufficient to advance each of the compartments 27 to 32 from one bay to the succeeding bay.

Figure 2:
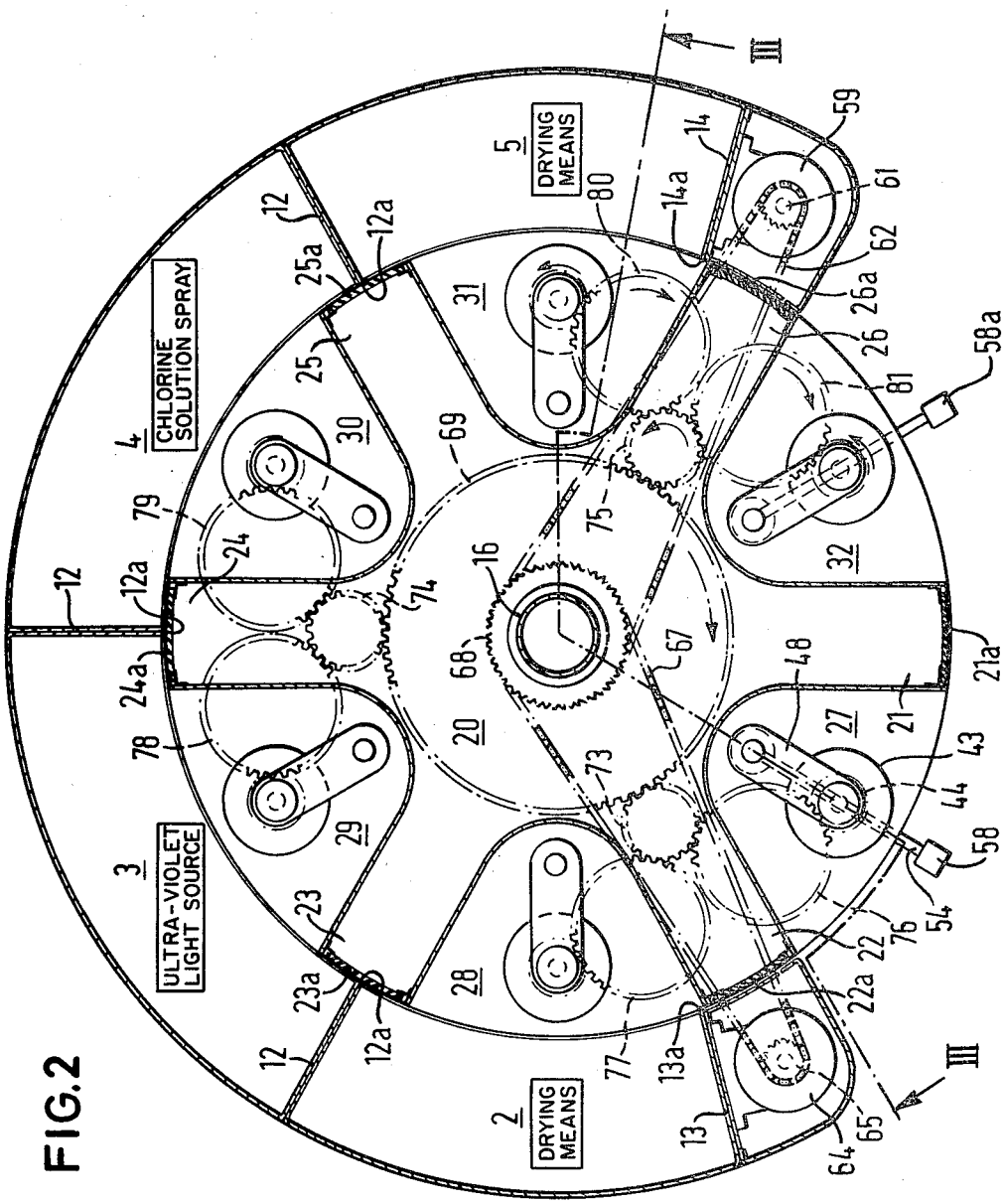
FIG. 2 is a plan view of the apparatus with an upper section removed.
Figure 3:
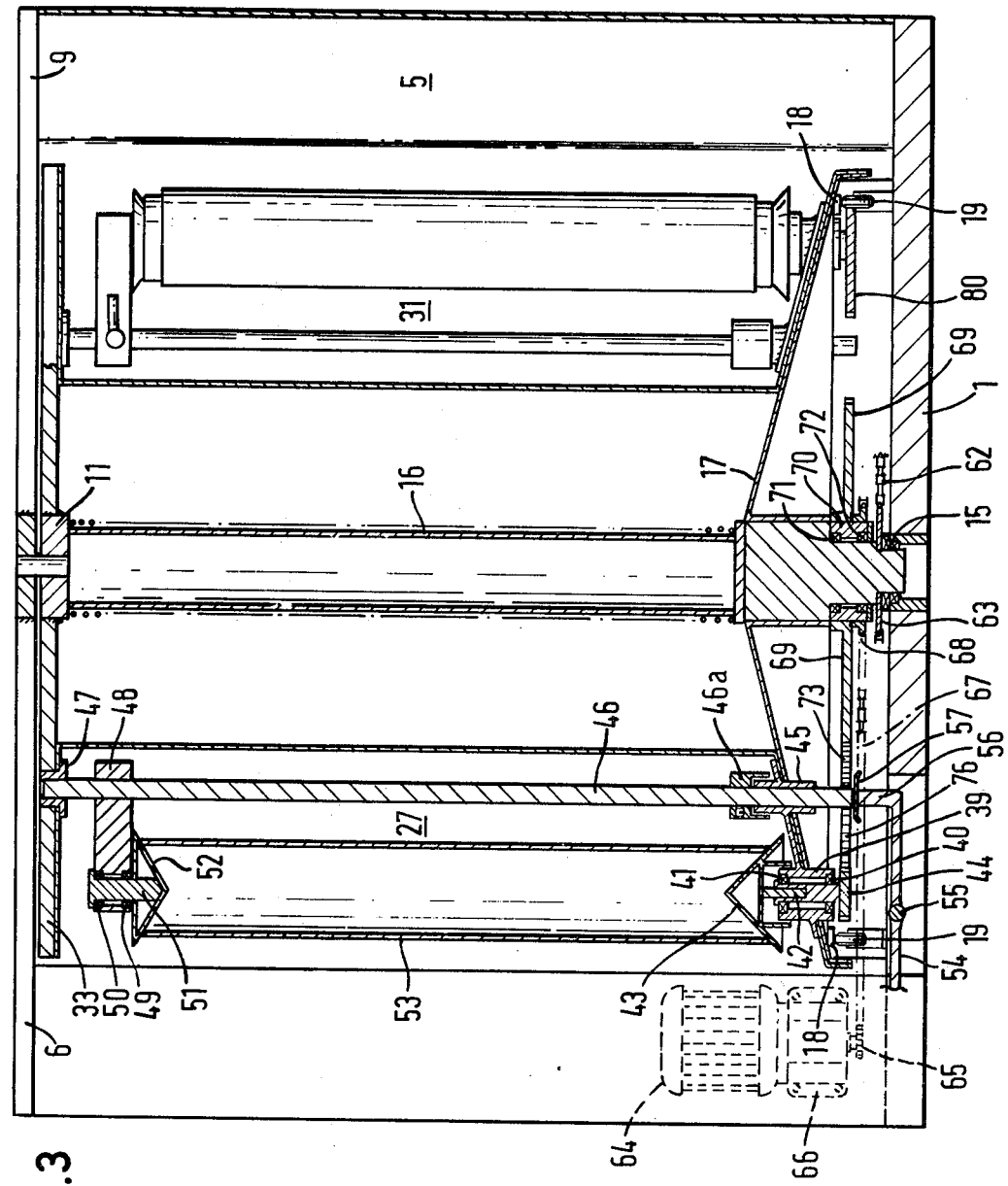
FIG. 3 is a schematic front view of the apparatus with parts removed and other parts shown in cross-section.

A second motor 64 drives a sprocket 65 through a gear-box 66, and a chain 67 drives a further sprocket 68 from the sprocket 65. The sprocket 68, together with a sun-wheel 69 is secured to a sleeve 70 surrounding the pillar 16 and rotatable relative thereto by virtue of bearings 71 and 72. Meshing with the sun-wheel 69 are three planet wheels 73, 74 and 75. The planet wheel 73 meshes with two gears 76 and 77 which are respectively also in mesh with the pinion 44 associated with the respective compartment. Similarly planet wheel 75 meshes with gear wheels 80 and 81. Each of the gear wheels 78 to 81 meshes with a pinion such as 44 of the respective compartment. It will readily be seen that operation of motor 64 will rotate the sun-wheel 69 so rotating all the planet wheels and transmitting drive to all of the conical mounting elements such as 43 through their respective pinions 44. Thus, a cylinder 53 mounted on a conical mounting member 43 in any of the compartments will be continually rotated as long as the motor 64 is running. One particular use of the apparatus is in finishing photopolymer printing cylinders. Such cylinders have been exposed through a negative to ultra-violet light and the areas so exposed have hardened due to that exposure, leaving soft unexposed areas between the hardened areas. After this exposure the soft material is then brushed out from the surface of the cylinder by means of a solvent applied in a brushing unit, so giving a cylinder with a relief printing surface. The first finishing operation is fully to dry the cylinder and in such case the bay 2 of the apparatus is a drying bay, including drying means represented schematically in FIG. 2, where hot air is injected into the compartment. Bay 3 is a post-exposure bay, including an ultra-violet light source represented schematically in FIG. 2, for exposing the whole surface of the cylinder to ultra-violet radiation, The third bay 4 is a chlorination bay where, including a chlorine solution spray represented schematically in FIG. 2, a chlorine solution is sprayed on to the surface of the cylinder to detackify this and so complete the hardening process. The fourth bay 5 is a further drying bay where, including drying means represented schematically in FIG. 2, the cylinder is again dried with hot air. To process a cylinder in this context using the apparatus of the invention an empty compartment of the apparatus is brought to the loading position indicated as compartment 27 in FIG. 2. The pedal 58 at that location is depressed so raising the upper conical mounting member 52 and the cylinder to be processed is placed over the lower conical mounting member 43, whereupon the pressure is removed from the pedal so lowering the upper mounting member 52. The conical shape of the mounting elements 43 and 52 will have the effect of automatically centering the cylinder as the element 52 is lowered. The motor 59 is then driven to index the turntable 17 through 60° and so advance the compartment 27 to the position of the compartment 28 facing the drying bay 2. During the dwell time in the drying bay the motor 64 is operated to rotate the cylinder 53 so that the whole of its surface is dried. After a suitable dwell time the motor 59 is again operated to index the turntable through a further 60° and move the cylinder on to face the ultra-violet source in bay 3. Again, in that bay the motor 64 is operated to rotate the cylinder 53 so that the whole surface is exposed. After a suitable time there is a further indexing step on to the chlorination bay 4, and then after chlorination a further indexing step on to the drying bay 5. In each of these bays the cylinder is again rotated by operation of the motor 64. A further 60° indexing operation then moves the cylinder to the unloading bay position 32 and the pedal 58a in that bay is then depressed to raise the upper conical mounting 52 so that the finished cylinder can be removed from the apparatus.

In order to prevent contamination between adjacent bays each of the separating members 21 to 26 carries at its free end a seal element 21a to 26a which in turn contacts radially inner extremities 12a of the walls 12 between the adjacent bays and also the radially inner extremities 13a and 14a of the end walls 13 and 14 of the bays, on which the motors 64 and 59 are respectively mounted.

It will be understood that drive systems other than that particularly described may be used and in particular each of the conical mounting members 43 may be driven from its own independent electric motor. Alternatively, different gearing arrangements may be used from that described. The arrangements for loading and unloading the cylinders may be varied from the foot-operated system shown. The number of treatment bays may be varied and of course the operations carried out in those bays may differ depending on the type of processing required for the cylinders.

We claim:

1. Apparatus for treating the surfaces of cylindrical objects in a number of sequential steps, comprising a carrier rotatable about a central axis, the carrier having a central section and a plurality of walls extending radially from the central section to define a radial series of compartments, means for rotating the carrier about said central axis, mounting means in each compartment for releasably engaging opposite ends of a cylindrical object to support said object in said compartment with the axis of said object parallel to said central axis, means for rotating said mounting means to rotate said object about its axis, a series of treatment bays arranged around the circumference of the carrier, means separating each treatment bay from any adjacent bay, cooperating sealing means on each separating means and each wall for creating a seal when the wall and separating means are radially aligned, and means for indexing said carrier through a plurality of angular positions wherein each compartment sequentially confronts a respective treatment bay and is sealed from adjacent treatment bays by said sealing means.

2. Apparatus according to claim 1 in which the carrier is capable of being indexed through two further angular positions, one of which constitutes a loading bay and the other of which constitutes an unloading bay.

3. Apparatus according to claim 2 in which the apparatus has the central axis vertical and the means for indexing the carrier and for rotating the mounting means are disposed in the lower portion of the apparatus.

4. Apparatus according to claim 3 in which the carrier comprises a base in the form of a turntable supported by wheels or rollers and the means for indexing the carrier is a first electric motor driving said turntable by way of a first chain drive.

5. Apparatus according to claim 3 in which all of the mounting means are rotated by gearing from a second electric motor.

6. Apparatus according to claim 5 in which said gearing comprises a sun-wheel co-axial with the central axis and a series of planet wheels engaging the sun-wheel, each planet wheel also meshing with gearing connected to at least one of the mounting means.

7. Apparatus according to claim 3 in which the mounting means comprises upper and lower conical elements for engaging the upper and lower ends of a hollow cylindrical object respectively, the lower element being connected to the rotating means and the upper element being axially movable towards and away from the lower element to releasably engage the cylindrical object.

8. Apparatus according to claim 7 in which means for raising and lowering the upper conical element are associated with each of the loading and unloading bays.

9. Apparatus for treating the surfaces of exposed photopolymer printing cylinders in a number of sequential steps, comprising a carrier rotatable about a central axis, the carrier having a central section and a plurality of walls extending radially from the central section to define a radial series of compartments, means for rotating the carrier about said central axis, mounting means in each compartment for releasably engaging opposite ends of an exposed cylinder to support said cylinder in said compartment with the axis of said cylinder parallel to said central axis, means for rotating said mounting means to rotate said cylinder about its axis, a series of bays arranged around the circumference of the carrier and comprising a loading bay where a cylinder may be loaded into a compartment, a first treatment bay including means for drying a cylinder, a second treatment bay including means for exposing a cylinder to ultra-violet light, a third treatment bay including means for spraying a cylinder with liquid, a fourth treatment bay including means for a drying a cylinder and an unloading bay where a cylinder may be unloaded from a compartment, means separating each treatment bay from any adjacent bay, cooperating sealing means on each separating means and each wall for creating a seal when the wall and separating means are radially aligned, and means for indexing said carrier through a plurality of angular positions wherein each compartment sequentially confronts the respective bays and is sealed from adjacent bays by said sealing means.

* * * * *

UNITED STATES PATENT AND TRADEMARK OFFICE
CERTIFICATE OF CORRECTION

PATENT NO. : 4,215,928

DATED : August 5, 1980

INVENTOR(S) : Barry J. Bayley, Austin Brittain, Kenneth Graham; Clive S. Thawley It is certified that error appears in the above-identified patent and that said Letters Patent are hereby corrected as shown below:

column 6, line 23 for "means for a drying"

read --means for drying--

Signed and Sealed this

Ninth Day of June 1981

[SEAL]

Attest:

RENE D. TEGTMEYER

Attesting Officer

Acting Commissioner of Patents and Trademarks